(12) United States Patent
Fiedler

(10) Patent No.: US 6,804,638 B2
(45) Date of Patent: *Oct. 12, 2004

(54) DEVICE AND METHOD FOR SELECTIVE RECALL AND PRESERVATION OF EVENTS PRIOR TO DECISION TO RECORD THE EVENTS

(75) Inventor: Mark Fiedler, New York, NY (US)

(73) Assignee: Recent Memory Incorporated, New York, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/884,532

(22) Filed: Jun. 20, 2001

(65) Prior Publication Data

US 2003/0040917 A1 Feb. 27, 2003

Related U.S. Application Data

(63) Continuation of application No. 09/201,359, filed on Apr. 30, 1999, now Pat. No. 6,205,419.
(60) Provisional application No. 60/148,622, filed on Aug. 12, 1999, provisional application No. 60/133,800, filed on May 11, 1999, provisional application No. 60/133,801, filed on May 11, 1999, provisional application No. 60/123,487, filed on Mar. 9, 1999, provisional application No. 60/123,486, filed on Mar. 9, 1999, and provisional application No. 60/115,274, filed on Jan. 8, 1999.

(51) Int. Cl.[7] .............................................. G10L 19/00
(52) U.S. Cl. ....................... 704/201; 704/270; 704/275; 360/60; 360/53; 360/48; 369/32; 369/54; 369/47; 369/58; 369/61; 369/72
(58) Field of Search ................................. 704/201, 231, 704/270, 275; 360/60, 55, 57, 53, 48; 369/56, 57, 47, 61, 32, 54, 58, 72, 48

(56) References Cited

U.S. PATENT DOCUMENTS

| | | | | |
|---|---|---|---|---|
| 4,331,837 A | * | 5/1982 | Soumagne | 704/215 |
| 5,053,896 A | * | 10/1991 | Sakata et al. | 360/71 |
| 5,379,153 A | * | 1/1995 | Ishii et al. | 360/27 |
| 5,386,493 A | * | 1/1995 | Degen et al. | 704/267 |
| 5,592,586 A | * | 1/1997 | Maitra et al. | 704/220 |
| 5,617,383 A | * | 4/1997 | Matsumoto et al. | 369/32 |
| 5,724,475 A | * | 3/1998 | Kirsten | 386/109 |
| 5,765,129 A | * | 6/1998 | Hyman et al. | 704/270 |
| 5,845,240 A | * | 12/1998 | Fielder | 704/201 |
| 6,205,419 B1 | * | 3/2001 | Fiedler | 704/201 |

* cited by examiner

Primary Examiner—Vijay Chawan

(57) ABSTRACT

A device process for event-activated recording generally includes the steps of providing an acquisition buffer having at least one finite extent of a recording medium. Events are recorded in the acquisition buffer. Current events in place of earlier events are then recorded within the acquisition buffer. Action by the user or triggering system activates the preservation of all or part of the record of the most recent events recorded in the acquisition buffer upon the detection of one or more predetermined events. A portion of the record of events selected by the user is preserved by reserving a portion of the record of events from being overwritten by other events, and/or by transferring the selected portions of the record of events to a predetermined permanent location. Portable devices and applications to the recording telephone conversations are also disclosed.

19 Claims, 12 Drawing Sheets

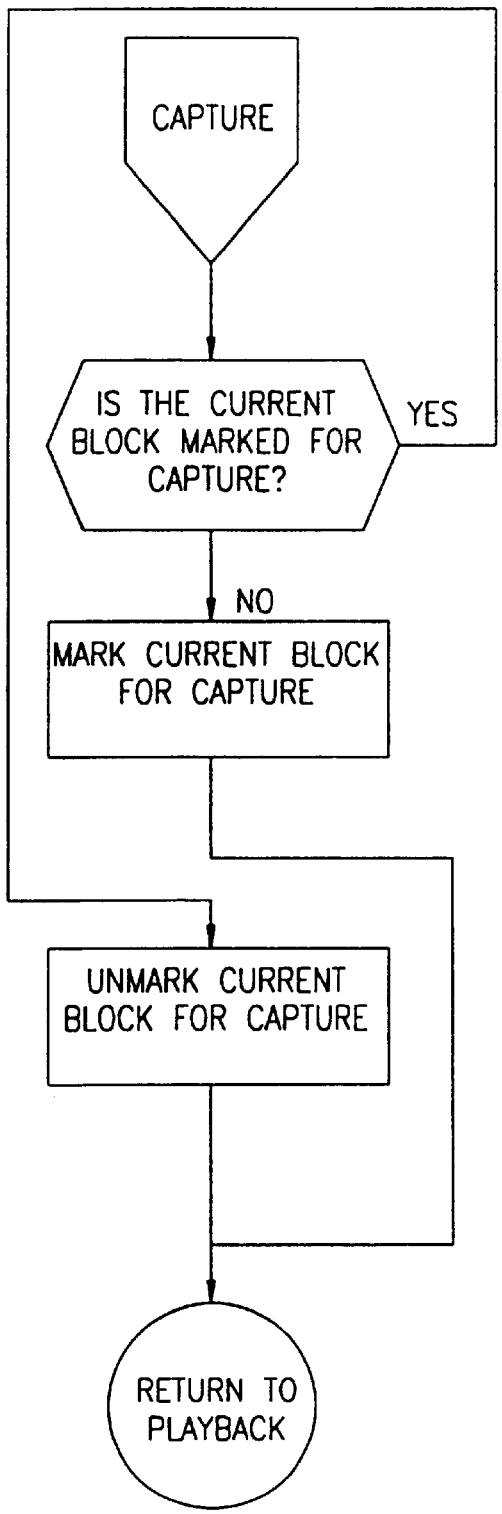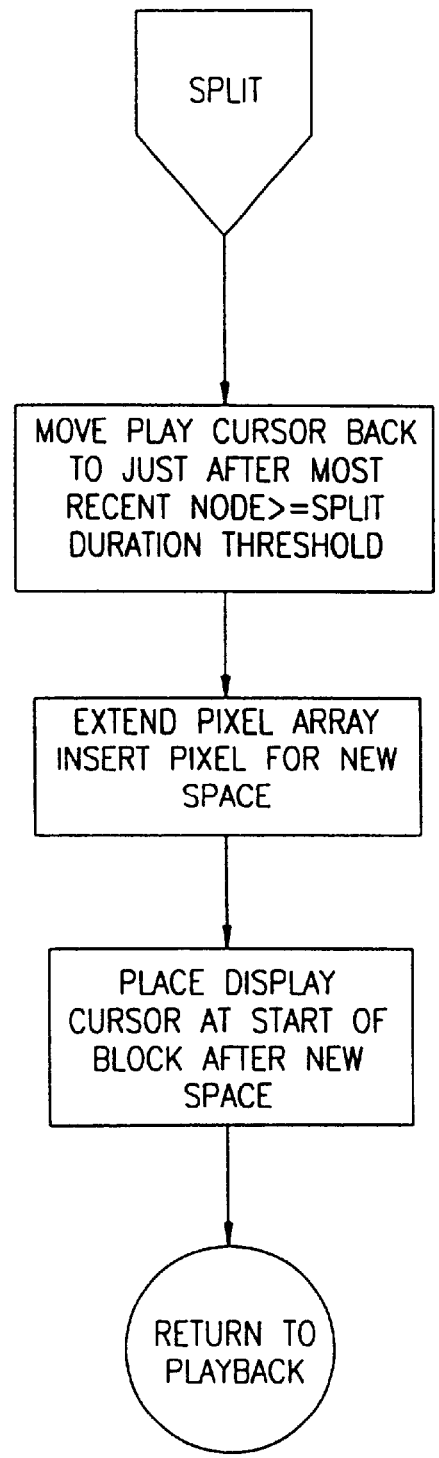
FIG. 9
FIG. 10

DEVICE AND METHOD FOR SELECTIVE RECALL AND PRESERVATION OF EVENTS PRIOR TO DECISION TO RECORD THE EVENTS

This is a continuation in part of U.S. patent application Ser. No. 09/201,359, filed Apr. 30, 1991, now U.S. Pat. No. 6,205,419 entitled "Selective Recall and Preservation of Continuously Recorded Data."

This invention is covered by the following provisional patent applications filed with the U.S. Patent and Trademark Office: Ser. No. 60/133,800 (Event-Activated Recording Method with Time Buffering), filed May 11, 1999; Ser. No. 60/133,801 (Applications and Improvements for Selective Recording Method), filed May 11, 1999; Ser. No. 60/148, 622 (Speech Searching), filed Aug. 12, 1999; Ser. No. 60/123,487 (Selective Recording Method Using Flash Memory), filed Mar. 9, 1999; Ser. No. 60/115,274 (Data Capture Device), filed Jan. 8, 1999; and Ser. No. 60/123,486 (Wrist Recorder), filed Mar. 9, 1999.

FIELD OF THE INVENTION

This invention relates to the mechanical, electrical, magnetic or other mechanized recording and reproduction of auditory and/or visual or other data, and particularly to improvements to a process of recording which enables human users to decide whether to preserve a record of events that have already transpired.

BACKGROUND OF THE INVENTION

My earlier patent, U.S. Pat. No. 5,845,240 (Selective Recall and Preservation of Continuously Recorded Data), discloses a recording method that effectively allows a user to decide to record an event after the event has taken place. This is achieved by continuously recording all ambient events in a continuous logical loop on a finite extent of recording medium and allowing users to select for permanent preservation portions of the material thus recorded, before they are overwritten with new material.

The present invention comprises improvements to and applications of this basic technology.

One area of technology addressed by the present invention is event-activated recording, in which a recording process is initiated on the occurrence of some event that is recognized by some mechanism, algorithm or other automated means. Current examples include:

(1) Voice-activated recording of speech
(2) Sound-activated recording of sound
(3) In a security system, audio and/or video recording activated on detection of movement
(4) In a medical instrument, recording initiated by some significant event, e.g., an arrythmia A drawback common to all of these methods is the fact that they do not record the often-significant events leading up to the event that triggers the recording process. (Indeed, because some time elapses between the occurrence of the triggering event, detection of the event, processing of the resulting signal, recognition of the event as significant, and finally initiation of the recording process, the triggering event is usually not recorded, or only partially recorded.)

The present invention overcomes this drawback by providing an acquisition buffer (of a rewritable recording medium) in which current events are continuously recorded. When the recording process fills the acquisition buffer, it overwrites the record of the earliest events recorded in the buffer with current events. On detection of a triggering event, a predetermined portion of the current contents of the acquisition buffer (which may be the buffer's entire contents, or may correspond to a time interval that a user may specify) is transferred to the (permanent) recording medium normally used for event-activated recording. This has the effect of permanently preserving the events leading up to the triggering event.

A further area of application of the present invention is telephony. Current methods of recording telephone conversations share the drawbacks of conventional methods of recording: a recording process must be initiated (and, when applicable, consented to by parties to the conversation) before any of the events to be recorded have transpired.

Accordingly, it is an objective of the present invention to enable the effective recording of portions of a telephone conversation after those portions have taken place. It is a further objective of the present invention to secure the consent of parties to the conversation as a condition of such recording.

It is a further objective of the present invention to enable the recording of different kinds of data on interchangeable media such as flash memory.

Portable recording devices constitute a further area of application of the present invention. Current portable recording devices share the drawbacks of conventional methods of recording: a recording process must be initiated before any of the events to be recorded have transpired. The present invention is embodies in two devices that overcome these drawbacks: a pocket device and a wrist recorder, both advantageously using interchangeable media such as flash memory.

SUMMARY OF THE INVENTION

The present invention differs enables users effectively to record words that have already been spoken, or events that have already taken place, prior to the time that a user decides to record them. This is achieved by recording events on a finite extent of recording medium in a continuous logical loop (i.e., overwriting the earliest recorded data with new data whenever the end of the medium used for this continuous recording is reached), and playing back and/or permanently preserving (capturing) portions of the recorded data as selected by the user.

A further advantage of this invention is that it allows users to preserve the spontaneity of their speech and actions by dispelling the self-consciousness that sets in when people know that they are being recorded-which happens even when people record themselves, triggered by the very act of switching on a recording device. Moreover: Even in continuous monitoring methods, where continuous recording on an indeterminate supply of recording medium is practicable, there is the need to go back to search for and edit out the parts to be preserved, discarding the rest. The present invention goes far towards eliminating that need, by capturing data permanently only in response to a user's explicit request (although this request must come within a predetermined, finite period from the time of the event).

The present invention may be applied to sound or video recording, as well as recording (1) the sequence of user actions (or other events) on a computer or other machine or on a musical instrument,
(2) streams of data produced by medical or weather instruments, or
(3) streams of data produced by any broadcasting means, including "netcasting" over the Internet.

The invention may be embodied, with varying degrees of practicality, using any rewritable recording medium, including electronic memory, tape, wire, or discs, both analog and digital. However, the current preferred medium for continuous recording is digital memory, as it entails a minimum of wear, power consumption and bulk—especially important in a portable device.

The essential components of this invention—beyond a minimum of appropriate hardware to detect, acquire and preserve data—are algorithms, which may be implemented as either hardware or software or both. The invention may be implemented as a program on a general-purpose computer, using either a single-thread or a multithreaded operating system, as long as means of acquiring and playing back data are provided.

Following is a description of an embodiment of this invention as a computer type program to capture audio data, running on an interrupt-driven computer of known type and using digital memory as the continuous recording medium. The same scheme may be used in a dedicated device other than a general-purpose computer; and variations of this scheme may be used to record other streams of events, e.g., video data. In this last case, the division of the continuous recording into blocks separated by intervals of silence may be replaced by a separation into blocks each having the same base frame as detected by a video compression algorithm.

This embodiment uses, in place of a single circular acquisition buffer for storing continuously recorded data, a circular array of smaller, separately allocated buffers. This arrangement affords a number of advantages on the design as compared with a single, larger buffer: (1) On general purpose computers, smaller blocks of memory are easier to allocate and move than larger ones; (2) smaller-size numbers (e.g., 16 bits for a 64 KB buffer) may be used to keep track of locations in the smaller buffers; and (3) this arrangement allows a simplified scheme for keeping track of areas that have been overwritten with fresh data.

BRIEF DESCRIPTION OF DRAWINGS

FIGS. 7–10 shows four flowcharts, detailing actions taken in response to various user controls.

DETAILED DESCRIPTION OF THE PREFERRED EMBODIMENT

Figure 1:
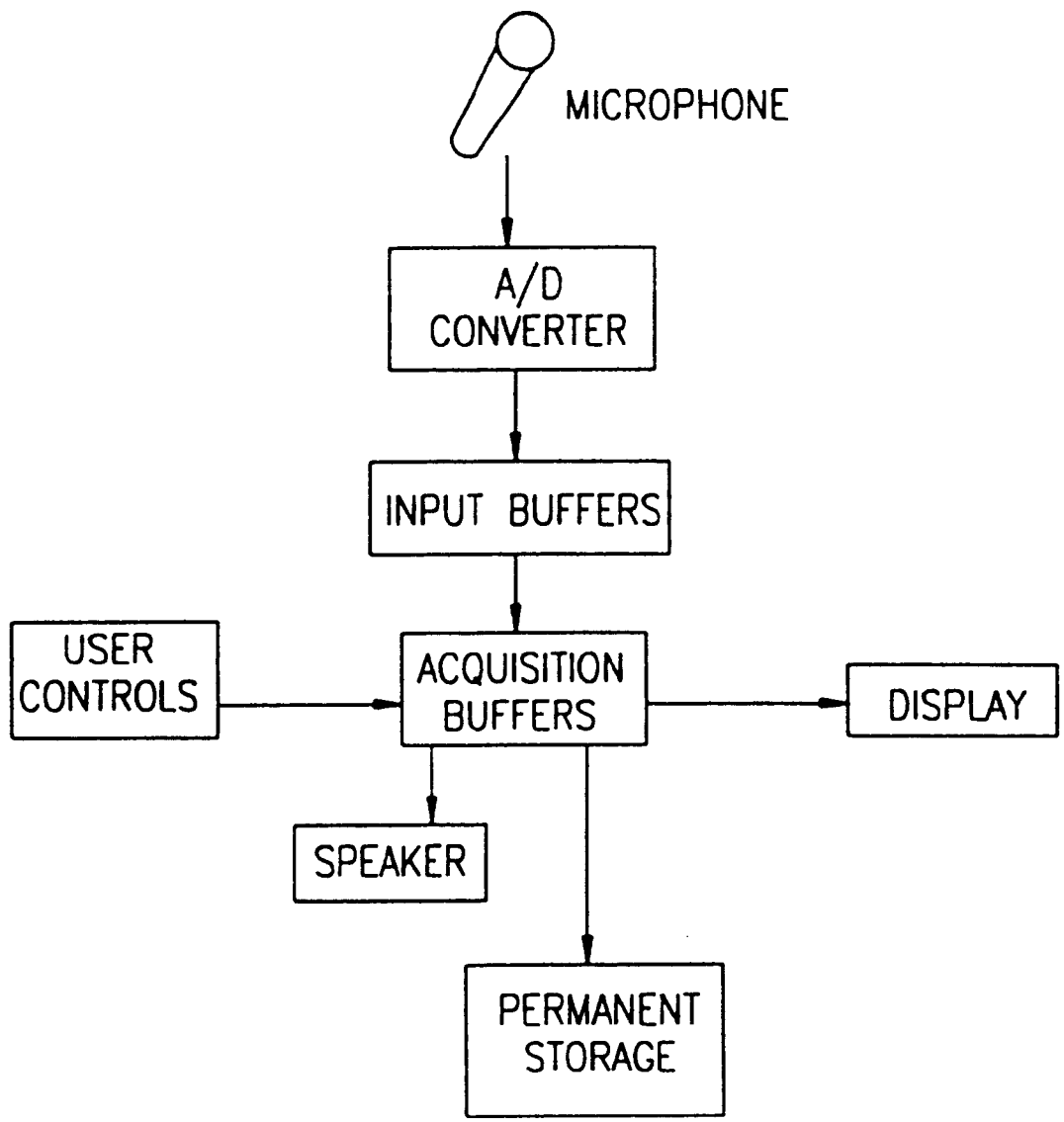
FIG. 1 shows an overall block diagram of the parts of the preferred embodiment and their interrelationships.

FIG. 1 shows the major components and their interrelationships: an analog input transducer such as a microphone feeding a continuous signal to an analog-digital converter, which in turn passes a train of digital sample values to a set of input buffers. From these the sample train is continuously supplied to a circular set of acquisition buffers. The contents of the acquisition buffers are shown on a periodically updated display, and parts of the contents of the acquisition buffers may, by means of user controls, be played back through an output transducer such as a speaker or selected for preservation in permanent storage.

Acquisition and Storage of Audio Data

Analog audio data are acquired through a microphone, telephone or similar transducer or input, converted into digital data at a certain sampling frequency by an analog-digital converter, and stored sequentially in a circular series of input buffers. (Input is by no means limited to these sources; it may also include the output of musical, medical, seismic or weather instruments. Input may also be digital in nature, as for example a stream of data broadcast over the Internet or other network, or issuing from any type of digital instrument.) In an arrangement typical of audio on personal computers, a peripheral sound card incorporating an analog-digital converter acquires audio signals and stores them sequentially via direct memory access (DMA) in a queue of input buffers allocated by an application program. As each input buffer in turn becomes full, an interrupt signal or a message identifying the particular buffer is generated. When the application program receives this signal or message, the sound data are transferred from that input buffer to acquisition buffers in memory in the manner described in the following paragraphs. Concurrently with this transfer of data, audio data continue to be fed by the analog-digital converter into another input buffer or buffers, each of which in turn generates a further interrupt or message when it becomes full. After the contents of each buffer are transferred to the acquisition buffers, the input buffer is assigned to the tail end of the queue awaiting recording. A-minimum of two input buffers, used alternately, is required. Particularly in multitasking systems, there may be times when no input buffers are available for recording because all allocated input buffers are still awaiting transcription; when this occurs, new input buffers may be allocated. The memory allocated for these buffers may be freed when no longer needed, or when the number of unrecorded but allocated buffers exceeds a certain number.

Figure 2:
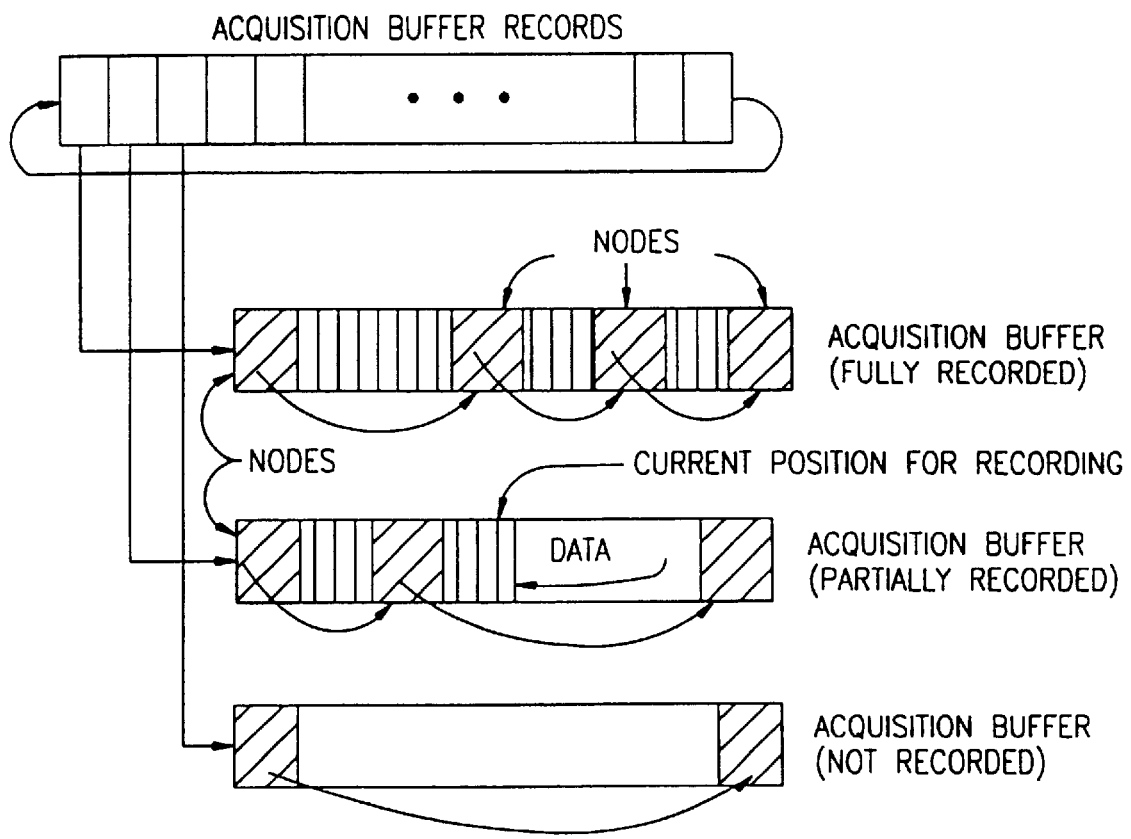
FIG. 2 shows the scheme for storing data in the acquisition buffers, using nodes to mark intervals of silence as well as the beginnings and ends of buffers. The array of acquisition buffer records is shown along with three representative acquisition buffers: one fully recorded, one partially recorded, and one not yet recorded.

An array of acquisition buffer records, illustrated in FIG. 2, provides access (for recording, playback and transfer to permanent storage) to the acquisition buffers and to the audio data stored in them. Each acquisition buffer record contains the following data:

tTime Number of sampling intervals elapsed, at the beginning of this buffer, since the beginning of the program run. In the record that terminates the array, this value is zero.

tEndTime Number of sampling intervals elapsed, at the end of this buffer, since the beginning of the program run.

pWhere Pointer to the acquisition buffer holding the audio data. In the record that terminates the array, this value is null.

The various acquisition buffers each contain, in addition to audio data, at least two nodes, which mark the beginning and the end of each buffer. Additional nodes, interspersed in the audio data, are used to mark intervals of silence (as determined in the manner described below) within the buffer. The successive nodes within each acquisition buffer form a two-way linked list. Each node contains the following data:

tDuration Duration of silent interval, in sampling intervals. Zero for nodes marking the beginning or the end of a buffer.

nNext Number of samples of sound data between the end of the current node and the location of the next node.

nPrev Number of samples of sound data between the beginning of the current node and the end of the previous node. This facilitates reverse playback as well as searching backwards.

FIG. 2 shows three acquisition buffers in various states of being recorded: Buffer 10 is completely filled, and has two silence nodes interspersed in the audio data; these forming a linked list with the beginning and end nodes of the buffer. Buffer 11 is partially filled with audio data, and its single silence node is similarly linked with the beginning and end node. Buffer 10 is empty of data, containing only the beginning and end nodes, which also form a linked list.

(In this acquisition buffer scheme, the data are held stationary in memory and accessed by moving cursors, as described below. An alternative dataflow arrangement is possible, in which data flow through a train of memory elements, all data elements moving to the next elements as each new sample is read in.)

Figure 4A:
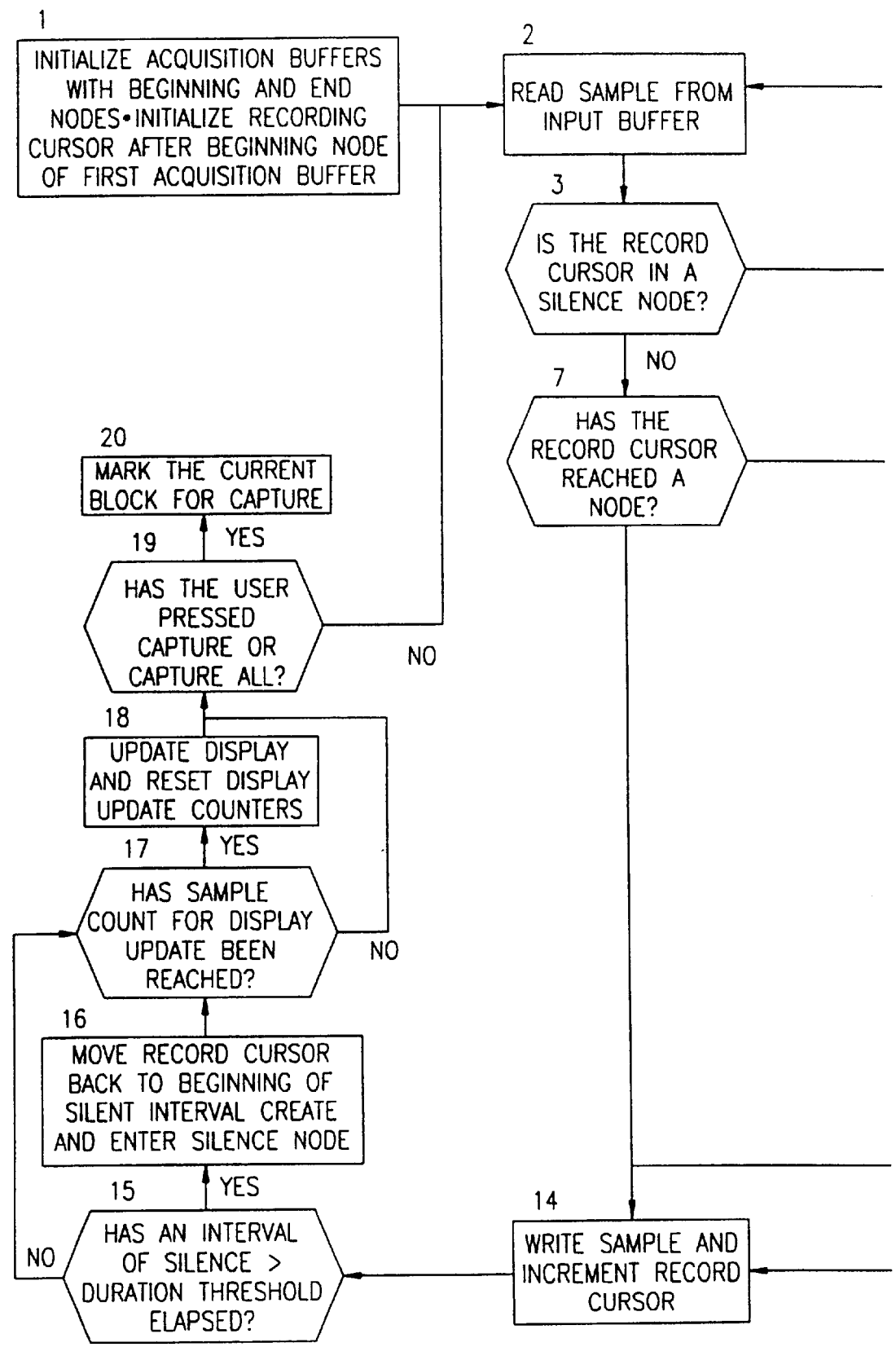
FIG. 4 is a flowchart of the continuous recording or acquisition process.
Figure 4B:
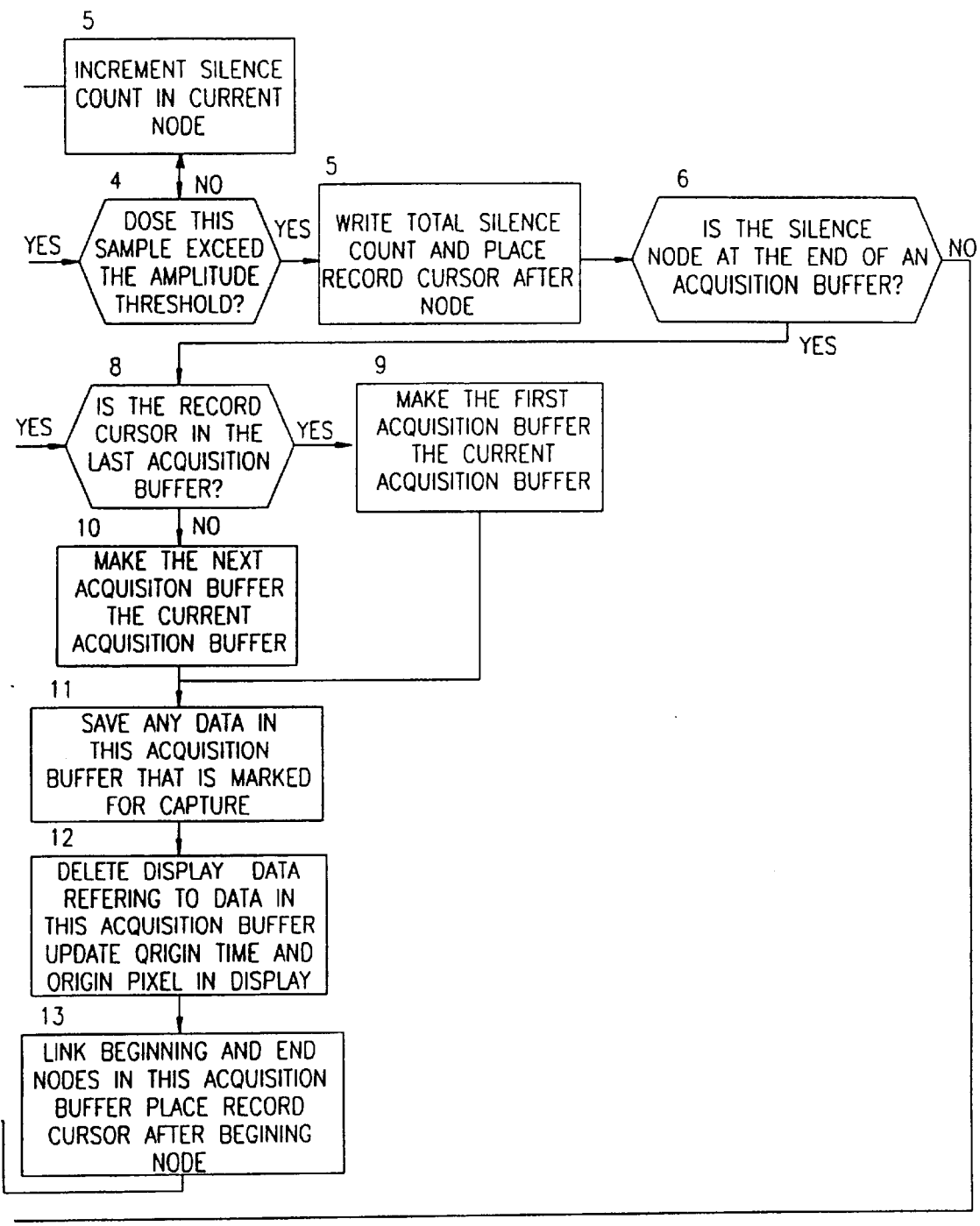

In the recording process illustrated in FIG. 4, the continuously acquired audio data are written successively to acquisition buffers, beginning with the acquisition buffer pointed to by the first record in the acquisition buffer table. When the recorded data reaches the end of that buffer (as indicated by reaching the node there, block 7), recording proceeds by writing to the acquisition buffer pointed to by the next record in the table. When the recording reaches the end of the acquisition buffer pointed to by the last acquisition buffer record, or the end of any other acquisition buffer except the last, recording proceeds with the acquisition buffer pointed to by the first record in the table, overwriting the existing contents of that acquisition buffer, (blocks 8–9).

On startup, each acquisition buffer is initialized with two nodes, one at the beginning of the buffer and one at the end. The nNext element of the beginning node points to the node at the end, and the nPrev element of the end node points to the beginning node (block 1; see also FIG. 2):

Any interval of audio data whose absolute amplitude values do not exceed a certain minimal level (the amplitude threshold) over a certain minimal duration (the duration threshold), and whose length exceeds that of a node, is treated as an interval of silence and is represented by a node in an acquisition buffer.

(This is a simple criterion for detecting an interval of silence; more sophisticated ones are possible, including those involving the detection and cancellation of ambient noise. Moreover, other signal-enhancement techniques, such as automatic gain control, may be incorporated in the continuous recording process.)

As audio data are transferred from the input buffers to the acquisition buffers, the successive amplitude values in the audio stream are measured against the amplitude and duration thresholds (FIG. 4, block 15), and the stream is accordingly stored in the acquisition buffers as segments of sound data interspersed with silence nodes. Whenever a new silence node is written in an acquisition buffer, its nPrev member is assigned the number of samples written between this node and the previous node, and the nNext member of the previous node is assigned the same value. Similarly, this node's nNext member is assigned the number of samples that may be written between this node and the node at the end of the acquisition buffer, and the end node's nPrev member is assigned the same value.

When a sufficient interval of silence has been detected, the recording cursor goes back to the beginning of the sequence of amplitude values in the acquisition buffers corresponding to this interval and writes a silence node there (blocks 15–16); this may involve going back into a previous acquisition buffer. Thus, if the data values at the end of an input buffer and those at the beginning of the next buffer fall within the threshold values for silence, or if the entire contents of successive buffers fall within the threshold values, a single node is generated with the total duration of the consecutive silent intervals.

If the beginning of a "silent" sequence is found to be within less than a node's length before the end node of the relevant acquisition buffer, the remaining spaces are filled in with actual amplitude values and the beginning node of the next acquisition buffer is used to mark the interval of "silence"; its duration is set to the remaining duration in the "silent" sequence.

In the foregoing discussion, references to "next" and "previous" acquisition buffers should be understood in light of the following: When the recording of incoming audio data reaches the end of an acquisition buffer, it resumes at the position following the beginning node of the acquisition buffer pointed to by the next acquisition buffer table element, except if the present acquisition buffer table element is the last element in the table. In that case, the "next" acquisition buffer is that pointed to b the element at the beginning of the acquisition buffer table. Likewise, the acquisition buffer table element "previous" to that at the beginning of the table is that at the end of the table. In this way, recording of amplitude data proceeds in a circular fashion, overwriting the oldest data with fresh data.

Event-activated recording, as described above, may be effected as follows: On detection of a suitable triggering event, a predetermined portion of the current contents of the acquisition buffer (which may be the buffer's entire contents, or may correspond to a time interval that a user may specify) is transferred to the (permanent) recording medium normally used for event-activated recording. This has the effect of permanently preserving the events leading up to the triggering event.

Alternatively, the portion of the acquisition buffer contents leading up to the triggering event may be transferred to a second acquisition buffer, which will be used in place of the original acquisition buffer for all purposes described below, including the presentation of data to the user for selection for recall and/or preservation.

This record of the events leading up to the triggering event is advantageously placed in the permanent record (or the second acquisition buffer) just prior to the triggering event, and advantageously forms a continuous record with the triggering event and the events following it. It is of further advantage to mark the triggering event in this continuous record.

Such a continuous record may be effected by:
(1) Continuing to record in the acquisition buffer the triggering event and the events following the triggering event,
(2) Concurrently with this continuous recording, copying the appropriate portions of the acquisition buffer contents to the permanent record (or second acquisition buffer), preserving the record of events prior to, including, and following the triggering event, and
(3) Recording events directly to the permanent record (or second acquisition buffer) when the copying process has caught up with the direct recording process by reaching the present moment.

Permanent preservation of the record of events may alternatively be effected by:

(1) Continuing to record in the acquisition buffer the triggering event and the events following the triggering event, and (2) Reserving the appropriate portions of the acquisition buffer contents (i.e., the record of events prior to, including, and/or following the triggering event) from being overwritten by the continuous recording process.

Whenever a previously recorded acquisition buffer is about to be overwritten with fresh data, the block record is checked to see if any of the buffer's contents have been selected for capture. If so, the selected data are written or appended to a file on the computer's hard disk (block 11). This file may be in a standard sound wave file format, suitable for playing through a standard media player program. Also, at this time, the origin time (whose value is the earliest time stored in the acquisition buffers) is updated to equal the start time of the next acquisition buffer record (block 12). Thus, the contents of any acquisition buffer in the process of being overwritten are unavailable for recall or storage.

In general, captured data may be preserved by writing it to any permanent storage medium, such as a disk, tape or (non-volatile) solid-state memory. Captured data may be preserved at any time between the decision to capture and the time that the data is overwritten; however, deferring storage until the acquisition buffer is about to be overwritten facilitates giving the user the ability to cancel the decision to capture a block of data.

When the system is to be shut down for any reason (as, for example, a critically low battery level), all captured data in the acquisition buffers are preserved prior to shutdown.

The capture interval, i.e., the time interval that may be captured before the user's decision to record, is a function of the quantity of recording medium and the recording density (i.e., length of recording time stored in a given quantity of recording medium). If captured data, rather than being transferred out of the acquisition buffer, are stored in a newly reserved area of the acquisition buffer, then the capture interval will diminish as this area becomes filled with captured data. Compression algorithms may be employed concurrently with recording the sound (as with the silence-node scheme described above), and/or on captured data in permanent storage, in order to maximize both the capture interval and the total recording time capacity of the device.

In addition to data compression, captured data may be further processed for quality or compactness, for example via phonetic transcription or any signal-enhancing postprocessing method. (Within practical limits, these techniques may be used on the continuously recorded data as well.)

User Interface

Figure 3:
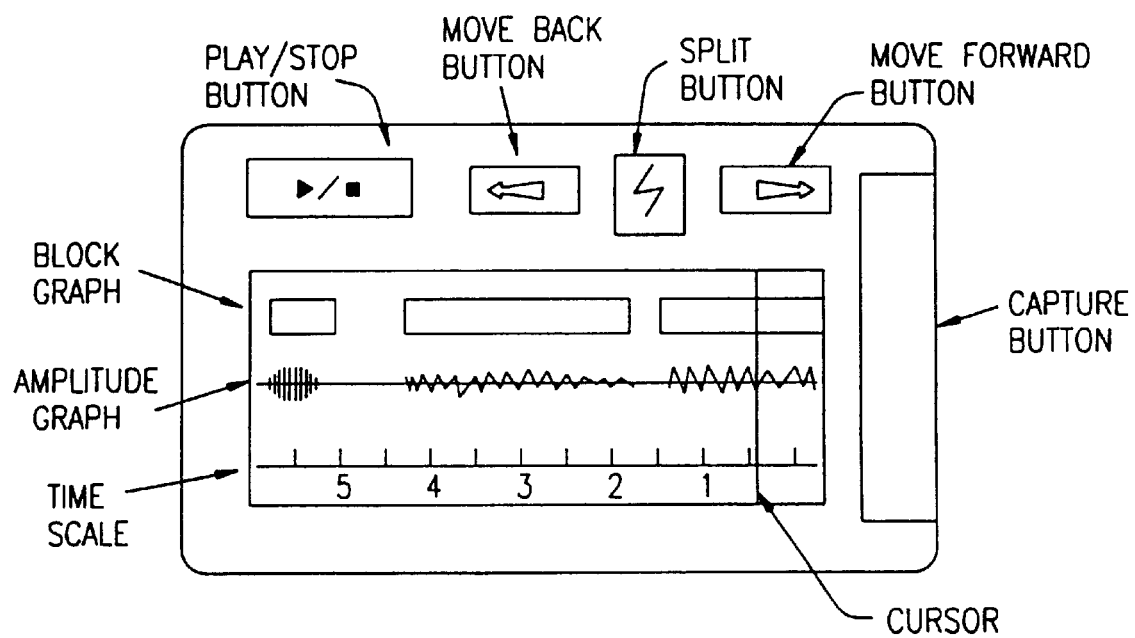
FIG. 3 shows the user interface, comprising the display and user controls, which may be embodied in a hand-held device or in a computer program.

The user is provided with a display representing audio data currently in the acquisition buffers, as well as controls to allow the user to recall (play back) data and to mark data for capture or permanent storage. All of these are shown in FIG. 3.

The Display Consists of Three Parts:

(1) A horizontal time scale marked in minutes and/or seconds, representing the positions in time relative to the current time of data in the acquisition buffers. (Alternatively, this scale may be marked with absolute time-of-day markings.)

(2) Parallel to the time scale, the amplitude graph, representing a series of numeric values, each of which is the maximum (or the average or some other relevant) amplitude value over its corresponding time interval. The amplitude graph may be a bar graph, a series of one-pixel-wide vertical lines whose heights correspond to the successive values in the amplitude record; or it may be a density graph, a series of vertical lines each drawn where the sum of successive amplitude record values reaches a fixed value.

(3) Parallel to the time scale and the amplitude graph, the block graph, representing the division of the contents of the acquisition buffers into blocks for selection and capture by the user. The displayed block graph represents the contents of the acquisition buffers divided into blocks separated by intervals of silence that exceed a minimum duration (the block separation threshold). The minimum duration of a block is identical to the duration threshold discussed under "Acquisition and Storage of Audio Data." Uncaptured blocks are shown as hollow rectangles on the block graph; captured blocks are shown as solid rectangles; and intervals of silence are shown as blank spaces between the displayed blocks.

A speaker, earphone or similar transducer or line output is provided for the purpose of playing back data in the acquisition buffers.

A cursor is provided, in the form of a vertical line intersecting or abutting the time scale, the block graph and the amplitude graph, to indicate (while in playback mode) the position on the display corresponding to the data being (or about to be) played back.

A function (the display update function) is called from time to time in the course of continuous recording, to update the display and its underlying data; this function is flow-charted in FIG. 5 and described in detail below.

The three parallel parts of the display represent, at any given time, the entire contents of the acquisition buffers (less any acquisition buffer currently being overwritten). As the physical space given to the display may be insufficient to represent these contents, the display may be provided with a means of scrolling its view to show the data for all times between the earliest time stored (the origin time) and the current time. Additionally, intervals of silence that exceed a certain length (the minimum ellipsis length) may be represented in all three display parts as the minimum ellipsis length, with a mark to show a "break" in the display.

Controls and Operation

Figure 7:
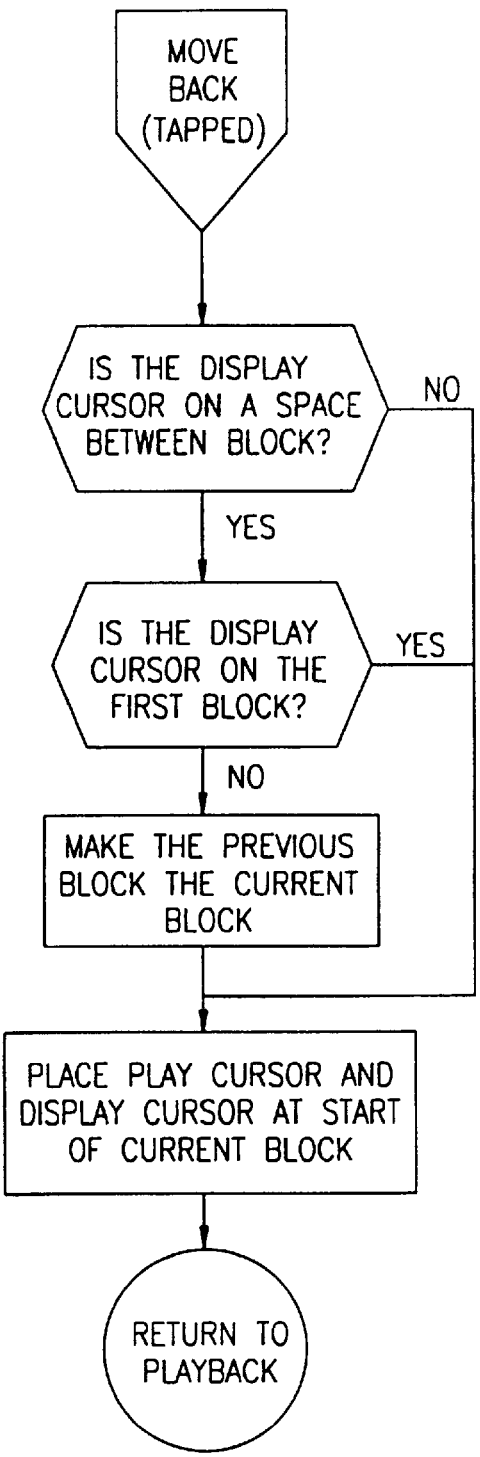

Controls (buttons) are provided for manipulating the cursor, playing back portions of recorded blocks, and capturing blocks:

Move Back If held and released quickly: Moves the (FIG. 7) cursor to the beginning of the current block.

If at the beginning of a block, moves to the beginning of the previous block. If not in default mode, the cursor appears at the beginning of the most recent block.

If held down: Moves the cursor continuously backward within the current block and previous blocks, as long as it is held down. (Optionally, plays back in reverse through this.) Normal playback continues when the button is released.

If not in playback mode, either action initiates playback mode as soon as the button is released.

Figure 8:
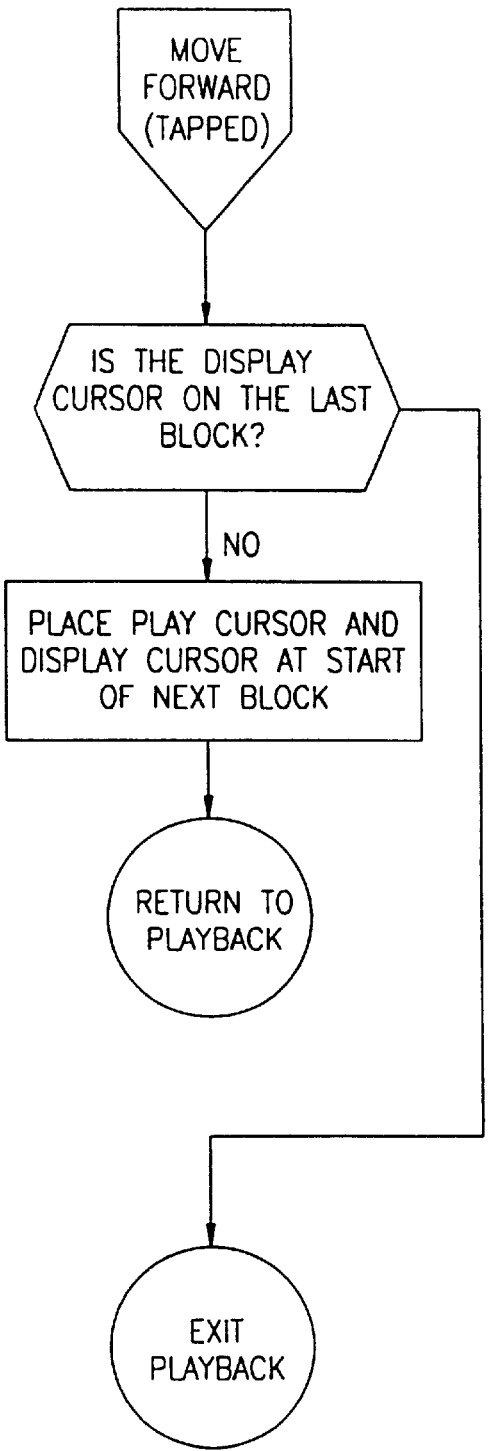

Move If held and released quickly: Moves the Forward cursor to the beginning of the next block to (FIG. 8) the right. If the cursor is on the rightmost block, this has the same effect as pressing Stop.

If held down: Plays fast-forward through the current block and succeeding blocks as long as the button is held down. Playback at normal speed continues when the button is released.

Stop Stops playback and resumes continuous recording (i.e., default mode). The cursor disappears.

Capture Toggles the capture state of the current block (FIG. 9) (as indicated by the visible cursor). May be pressed at any time to capture the current block. A second press releases the current block from capture. In default mode, captures the most recent block(s). (See below for details of default mode behavior.)

Capture All
When pressed, all blocks acquired thereafter are marked for capture; when pressed a second time, restores normal mode in which blocks acquired thereafter are not marked for capture. In either mode, the Capture control may be used to toggle the capture state of any. particular block, including the one currently being acquired.

Split Divides the current block into two blocks. The (FIG. 10) division is made at the last silence before the current cursor position that exceeds a certain minimum duration (the-split duration threshold) before the button is pressed. A second press undoes the division, if no other button has been pressed after the Split button (or if a sufficient time has elapsed from pressing the Split button).

Figure 6A:
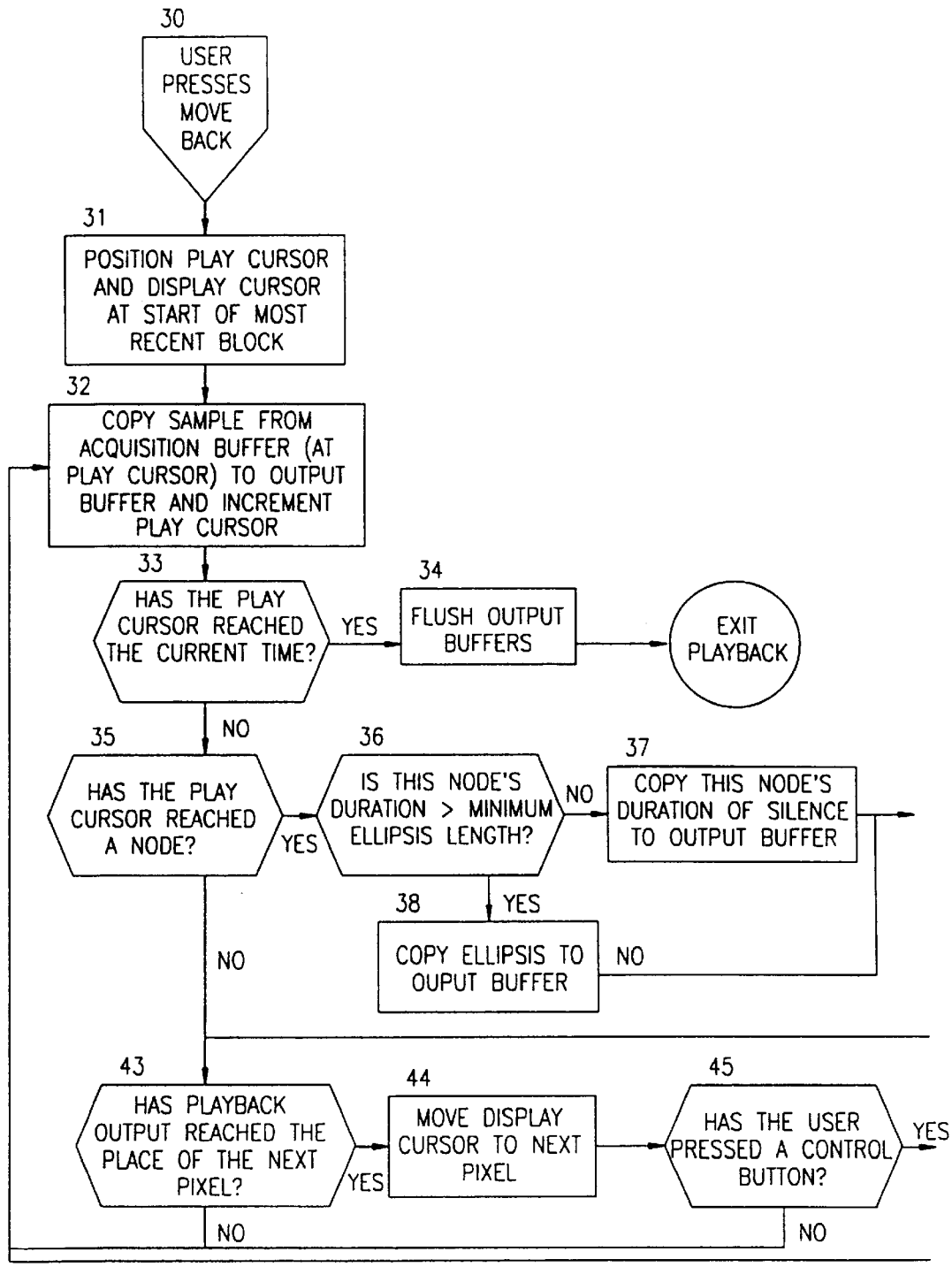
FIG. 6 is a flowchart of the process of playing back acquired material in response to a user's request.
Figure 6B:
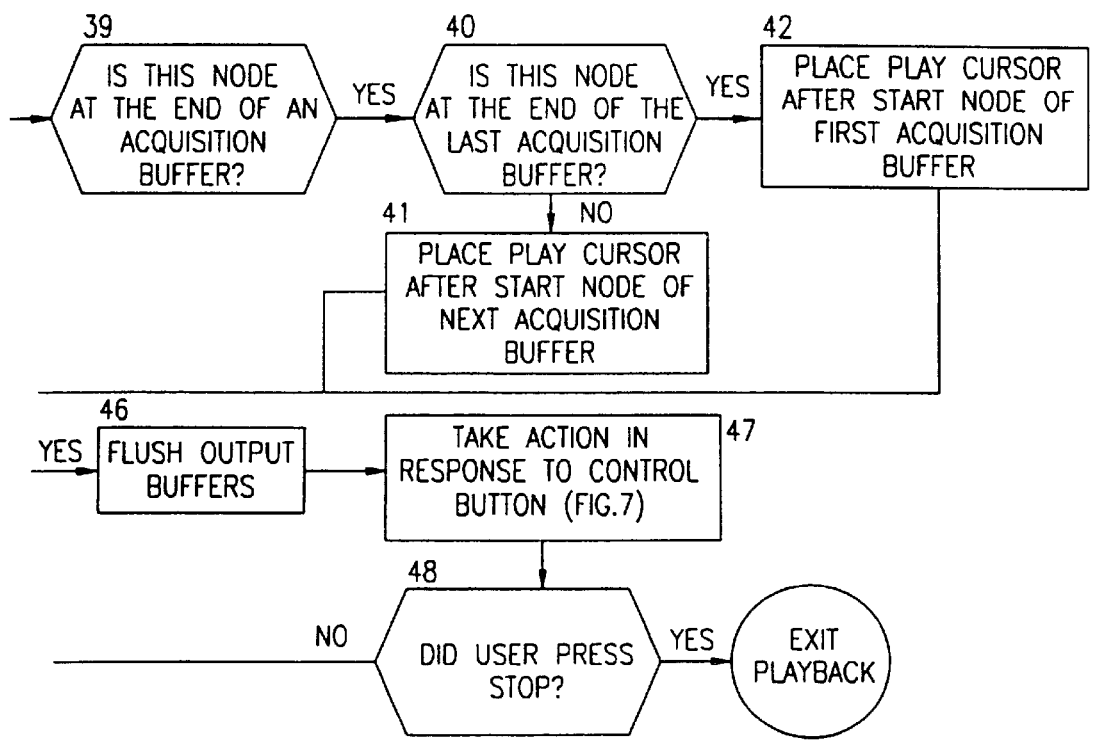

The behaviors described above apply to playback mode, which is entered by pressing or holding down the Move Back button, then releasing it. While in playback mode, the system continuously plays back material in the acquisition buffers, in a forward direction at the same speed as recorded, as long as no keys are being pressed or held down. The playback process is illustrated in FIG. 6.

The default mode of the device goes into effect on startup, and is reverted to from playback mode either on pressing the Stop button or when playback reaches the current time (or, if the implementation is capable of simultaneous recording and playback, after the controls have not been manipulated for a certain interval of time). In default mode, no cursor is shown on the display; pressing the capture button captures the most recent block. (Alternatively, pressing Capture once may capture the most recent minute, pressing it twice in rapid succession may capture the most recent two minutes, and so on. These intervals may be adjusted to the nearest block boundary.) If this most recent block continues through the time the capture button is pressed—i.e., if less time than the block separation threshold of detected silence had elapsed before the capture button was pressed-the device continues to capture data until either the capture button is pressed again or a sufficient pause has been detected. (The device may sound an audible warning at that point, giving the user a choice whether to continue capturing.)

In some implementations (e.g., on personal computer systems employing two sound cards), the acquisition of current audio data through the input buffers into the acquisition buffers continues through the user's manipulation of the controls and during playback. In other implementations, the continuous recording is suspended while in playback mode. Specifically, a typical single sound card on a personal computer cannot record and play back simultaneously.

Data Elements

The data representing intervals of sound and silence are identified by the times of their occurrence and the Places where they are stored in the acquisition buffers. Times are identified by unsigned long integers representing the number of sample intervals (or "ticks") that have elapsed in the course of the continuous recording process. In working with these quantities, consideration must be made for the possibility of the maximum possible long integer value being reached and "wrapping around" to zero; this may be handled by an appropriate overloading of operators and functions, taking the current value of origin time into account.

Places in the acquisition buffers are represented by structures containing the following data:
tTime Number of sample intervals elapsed up to this point in the continuous recording process.
pAcqbuff Pointer to the acquisition buffer record for the acquisition buffer containing this Place.
pWhere Pointer to the current place in the acquisition buffer. If in a silence node, this points to the beginning of the node.
tTixTillNode
Number of samples (going forward) before the next node; 0 if in a node.
tNodeTix Number of sample intervals elapsed within the current silence node; 0 if not in a node, so count begins with 1 and ends with the node's tDuration.

Places constitute the base class for a number of logical cursors, for the various functions of recording, playing back and storing sampled audio data, as they allow random access to any point in the acquisition buffers. For the same reason, places are also incorporated in the data underlying the user interface, where they allow for easy translation between the display elements and the corresponding places in the user interface graphs.

Implementation

The data underlying the user interface are implemented in the form of a circular, expandable array of pixel records each containing sufficient data to support one linear element of the time scale, the amplitude graph, and the block graph. Each pixel record contains the following data:
nBlocking
An enumerator indicating the status of this element in the block graph. Possible values are: SPACE (indicating an interval, or part of an interval, of silence), BLOCK (indicating an interval, or part of an interval, of sound), and CAPTURED_BLOCK (indicating an interval, or part of an interval, of sound that has been marked by the user for permanent storage).
sAmplitude
A sample value representing the amplitude to be shown for this element in the amplitude graph.
plWhere A Place record corresponding to the beginning of the corresponding interval in the acquisition buffers. At the beginning of a contiguous sequence of BLOCK, SPACE, or CAPTURED_BLOCK pixels, this is the location at which the actual interval of silence or sound begins in the acquisition buffers: it points to a node (for SPACE) or points to data immediately following a node (for BLOCK or CAPTURED_BLOCK).

Figure 5:
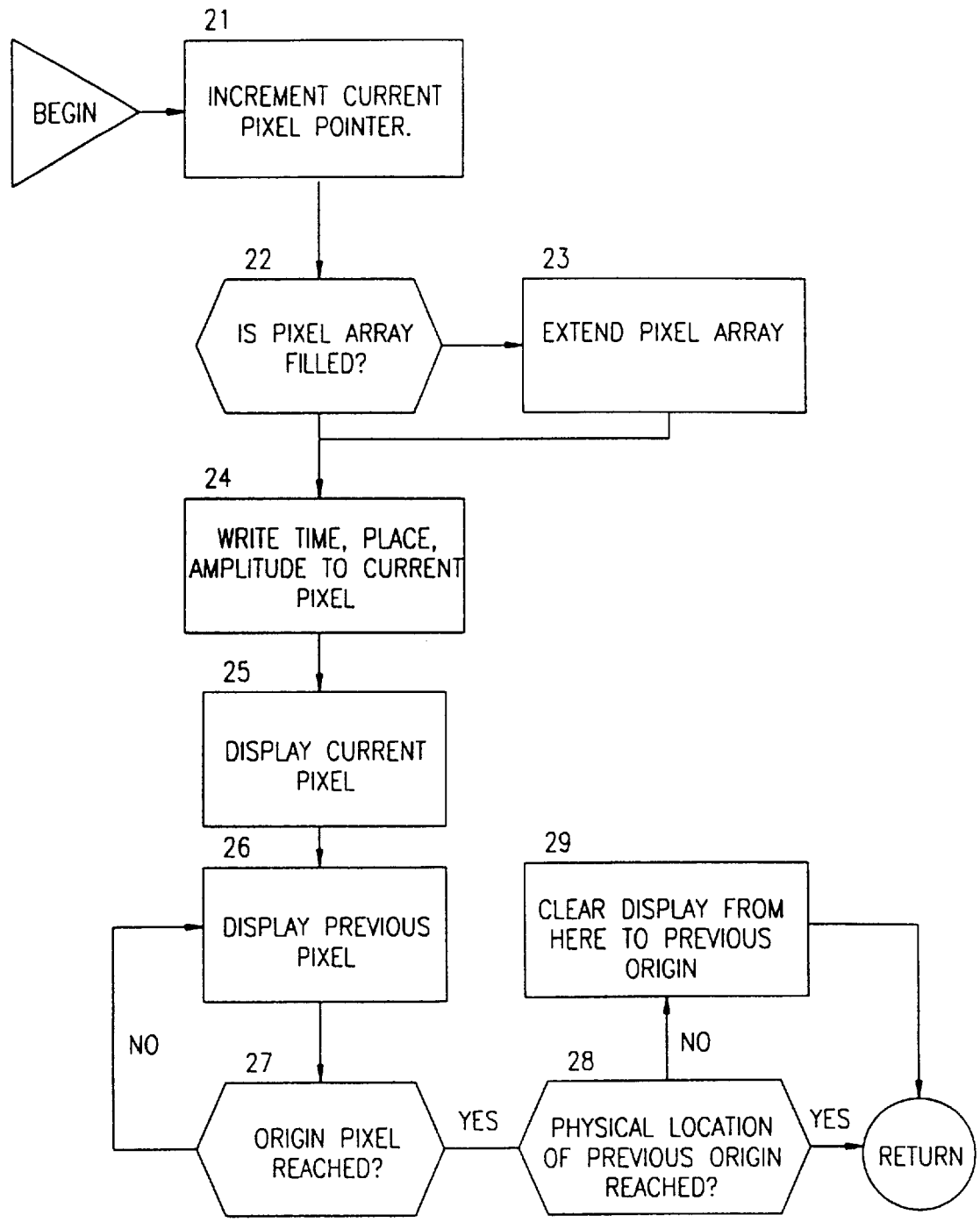
FIG. 5 is a flowchart of the periodic process of updating the display as audio data are acquired.

FIG. 5 illustrates the display update function, which writes new pixel records and is called at regular intervals in the continuous recording process, corresponding to the duration of one pixel record. Its arguments include the data for the pixel record it writes: the current time and Place in the acquisition buffer and the relevant (maximum or average) amplitude value; this value is reset in preparation for the next pixel interval. The display is updated to show the new pixel, in all three graphs, at the right edge of the display (representing the present time), shifting all previous pixels to the left (blocks 26–27). To facilitate this shifting in the display, a pointer to the current pixel (representing the current time) is incremented with each new pixel written (block 21).

Each new pixel record in turn is written at the location in the pixel array immediately following the last written pixel element. When the end of the pixel element array has been reached, the next pixel element is written at the beginning of the pixel array, provided that the existing pixel element at that location does not represent data remaining in the acquisition buffers. If the existing pixel record does represent still-valid data (block 22), then the pixel array is expanded (as by reallocating memory at a different location).

The time scale is constructed from time values contained in the plWhere members of each pixel record, which will not necessarily form a linear progression of times: Not only are the Places contained in pixel records adjusted on block boundaries, but there may also be breaks representing long intervals of silence, or places where an extra pixel was added to produce a visible blank space in the block graph for an otherwise insufficiently long interval of silence. The time scale is appropriately marked to reflect these possible irregularities.

Any interval of silence exceeding a predetermined length (the minimum ellipsis length) is represented by an "ellipsis" or break in the display, shorter than the corresponding actual number of pixels. When such an interval is encountered in playback, a short "ellipsis" waveform representing the break is played instead of playing through the entire duration of the silence.

Playback is achieved by means of a scheme analogous (in reverse) to the recording scheme: The Place represented by the current pixel record (as indicated by the current cursor position) is found in the acquisition buffer, and the audio data following it is transcribed to a queue of output buffers allocated by the application program. In the transcription process, audio data are transcribed identically and silence nodes are expanded to their full durations; the intervals stored as silence nodes may be filled with zero-amplitude values or with a dithering waveform containing values differing from zero by no more than the amplitude threshold (FIG. 6, block 37). Output buffers are sent, in the order transcribed, to a waveform output device, which in turn routes their contents (via direct memory access (DMA)) through a digital-analog converter to the audio output. Concurrently with this playback process, audio data continue to be transcribed from the acquisition buffers into another output buffer or buffers, each of which in turn generates a further interrupt or message when it has finished playing back. When this occurs, the output buffer is assigned to the tail end of the queue awaiting transcription from the acquisition buffers. (By keeping track of the corresponding Places in the acquisition buffers and the display data, the cursor may be appropriately advanced on receiving this message or signal.)

A minimum of two output buffers, used alternately, is required. Particularly in multitasking systems, there may be times when no output buffers are available for transcription because all allocated output buffers are still awaiting playback; when this occurs, new output buffers may be allocated. The memory allocated for these buffers may be freed when no longer needed, or when the number of allocated but untranscribed buffers exceeds a certain number.

When any key that moves or activates the cursor is pressed, playback must be interrupted. This involves forcing the return of any partially played output buffer and removing any remaining output buffers from both the queue awaiting playback and the queue awaiting transcription from the acquisition buffers (FIG. 6, block 46). Responses to various user control actions are flowcharted in FIGS. 7–10.

In implementations that are not capable of concurrent recording and playback, recording must be terminated in the same instantaneous manner when any key that moves or activates the cursor is pressed. This involves forcing the return of any partially recorded input buffer (noting the actual quantity of recorded data therein) and removing any remaining input buffers from both the queue awaiting recording and the queue awaiting transcription into the acquisition buffers.

In implementations capable of concurrent recording and playback, processing time must be appropriately apportioned (by means of program threads or otherwise) to the queue of input buffers awaiting transcription to the acquisition buffers and the queue of output buffers awaiting transcription from the acquisition buffers, when both processes are actually occurring at the same time. That is, processing time should be apportioned to minimize the number of buffers in the input queue while ensuring that there will be a certain minimum number of buffers in the output queue.

The present invention may be used to record telephone conversations and make portions of those conversations available for recall or preservation to parties to the conversation upon the consent of any or all of the other parties. In this context, it is advantageous:

(1) to generate an indication audible to all (or selected) parties when any party moves to recall or preserve a portion of the conversation, (2) to replay audibly for all parties (or for a selected party or parties) any portion of the conversation that any party has selected for recall or preservation, (3) to require the consent or all parties (or of a selected party or parties) to the recall or preservation of any portion of the conversation before effecting that recall or preservation, (4) to authenticate the identity of parties to the conversation (for the purpose of consent, or any other purpose) using "digital signatures" or other cryptographic means, or biometric means such as "voiceprint," and (5) to clear the contents of the acquisition buffer(s) when any party (or any selected party) has left the conversation, thereby ensuring the security of this consent arrangement.

The operations of initiating recall, controlling playback and effecting preservation of portions of a telephone conversation may be implemented using a display and controls similar to those described above, or more simply using well-known voice response methods and telephone keypad buttons. Effective after-the-fact recording of a telephone conversation, even with this type of security arrangement, need not be limited to the duration of a call; any party may initiate a call to a recording service which will in turn contact the other required parties and secure their consent. The acquisition buffers may be located either centrally or in the local telephone equipment of any of the parties; for added security, their contents may be encrypted.

In applications of the present invention, a non-volatile, interchangeable memory module (as of the type commonly known as "flash memory") may be used as a recording medium, for the acquisition buffer(s) and/or as a permanent storage medium. Where such interchangeable memory is used, it is advantageous to use such memory interchangeably in a variety of devices and/or to record a variety of sources of continuously recordable events (e.g., radio, television, live microphone, weather instruments, medical instruments, musical instruments). In this way a single flash memory may be used to acquire, recall and/or preserve data from various sources.

This is effected by recording the identity of the various sources of the data in said flash memory, so that the data may be appropriately reproduced.

Figure 11:
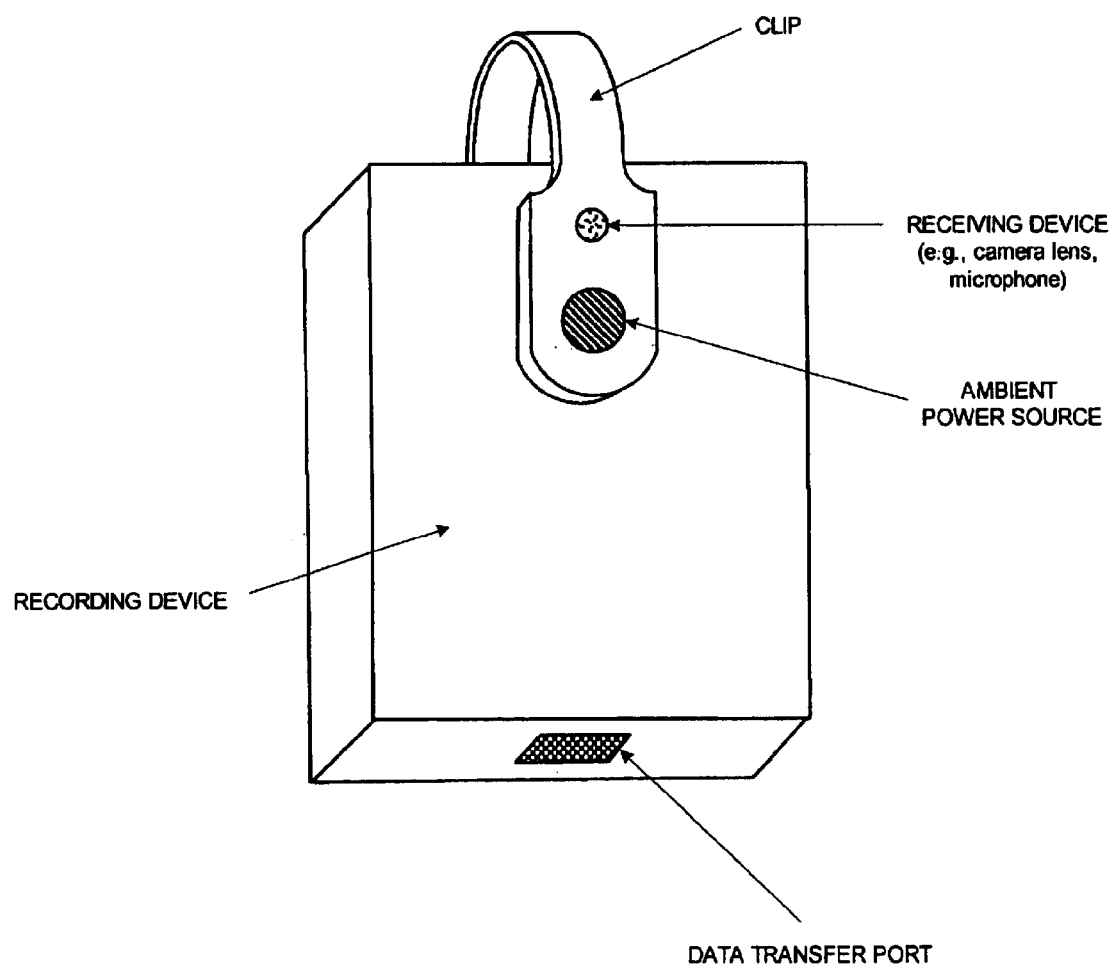
FIG. 11 shows a pocket recording device.
Figure 12:
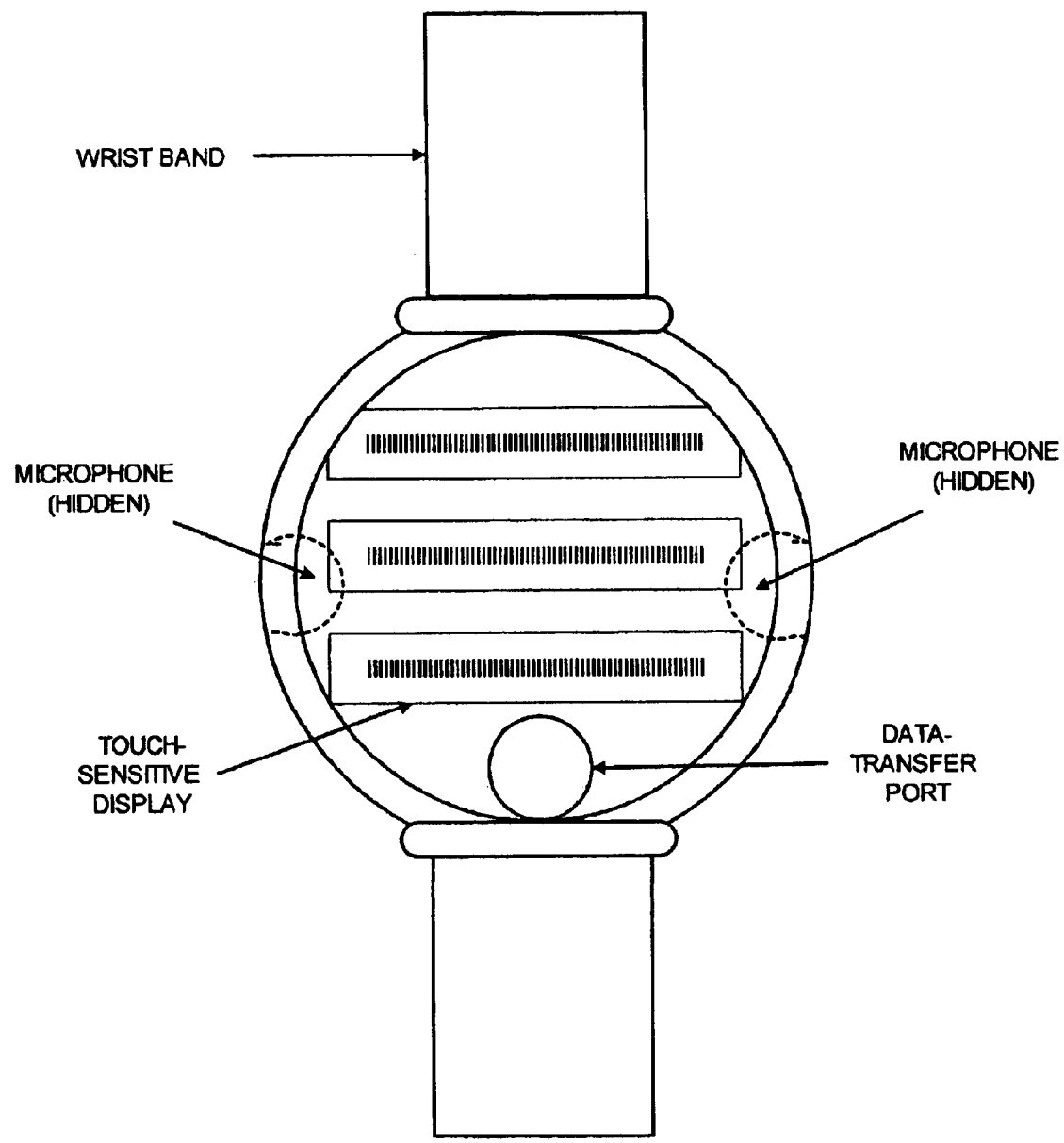
FIG. 12 shows a wrist recording device.

The present invention may be advantageously embodied in a portable device that clips to a pocket or other article of clothing, as shown in FIG. 11. A microphone, camera, camera lens, infrared or radio-frequency receiver, or similar device is attached to the clip, exposed to the outside environment. The clip may also carry a photoelectric cell or other ambient power source exposed to the environment, drawing power from ambient light (or other ambient power), advantageously charging a storage battery so as to provide continuous power to the apparatus. The recording device advantageously records to digital memory or a similar medium with modest power requirements.

In this arrangement, the clip physically stabilizes the receiving device, placing it in an advantageous position to record ambient events surrounding a person while avoiding extraneous noises such as might result from handling the microphone or allowing it to "flop around" freely. A display and controls for effecting recall and/or preservation of recorded data, similar to those described above, may be advantageously provided on the portion of the device carried in the pocket.

Here it is of further advantage to preserve material by reserving portions of the buffer from being overwritten, in order to use the entire memory store as needed. To effect transfer of material selected for permanent preservation out of the device, a data transfer port (infrared, Toslink or the like) should be provided. Alternatively, flash memory (as described above) may be used for this purpose.

An alternative embodiment of the present invention is a small device mounted on a wrist band or bracelet to secure the recording device to a human wrist, in the manner of a wristwatch. This device advantageously incorporates an attached microphone or microphones, exposed to the outside environment so as to pick up ambient sounds. This microphone or microphones may be recessed below a projecting lip on the upper surface of the recording device, so as to pick up ambient sounds while avoiding noise from clothing objects that may come into contact with the surface of the recording device. The top surface of the device provides a display, similar to that described above, representing events recorded and/or to be recorded, as well as controls for effecting recall and preservation of events. Display means may be implemented as an LED or LCD display, and controls may be implemented as discrete buttons and/or as touch-sensitive regions of said display, advantageously manipulated using a stylus.

The wrist band physically stabilizes the microphone, placing it in an advantageous position to record ambient events surrounding a person while avoiding extraneous noises such as might result from handling the microphone or allowing it to "flop around" freely. The device may also carry a photoelectric cell or other ambient power source exposed to the environment, drawing power from ambient light (or other ambient power), advantageously charging a storage battery so as to provide continuous power to the apparatus. The recording device advantageously records to digital memory or a similar medium with modest power requirements.

Here again it is of further advantage to preserve material by reserving portions of the buffer from being overwritten, in order to use the entire memory store as needed. To effect transfer of material selected for permanent preservation out of the device, a data transfer port (infrared, Toslink or the like) should be provided. Alternatively, flash memory (as described above) may be used for this purpose.

This apparatus may also be advantageously combined with or incorporated in a wristwatch and/or any of the various devices or functions currently or hereafter combined with wristwatches: In this case, the recording display is advantageously implemented as one of a plurality of available display modes of the device.

The recording device advantageously records to digital memory or a similar medium with modest power requirements.

Although the present invention has been described in connection with particular applications thereof, it is to be understood that additional embodiments, applications, and modifications, which will be obvious to those skilled in the art, included in the spirit and scope of the invention.

In the following claims:

The term "events" includes, without limitation, any auditory or visual events, data or signals, still or moving pictures, machine events, states or signals, and the states, signals or sounds of any musical instrument, any of the foregoing being of a discrete or a continuous nature.

The term "recording medium" or "medium" refers to any material or apparatus, whether now existing or hereafter invented, that is capable (whether alone or in combination with other components) of receiving impressions of events external to said material or apparatus, and of reproducing said impressions in combination with appropriate means. This term includes, but is not limited to, magnetic and optical media (tapes, disks, etc.) as well as all varieties of electronic memory, both volatile and non-volatile.

The term "acquired data" or "recorded data" or "data" refers to said impressions of external events on a recording medium.

The term "interval of silence" refers to any time interval of sufficiently low content or change (as determined by an apparatus or algorithm) as to be considered empty of any material worthy of recording.

While the preferred embodiment of the invention has been described in detail, modifications and adaptations may be made thereto, without departing from the spirit and scope of the invention, as delineated in the following claims.

I claim:

1. A process for event-activated recording, said process comprising the steps of: providing an acquisition buffer comprising at least one finite extent of a recording medium; providing a continuous acquisition means for recording events in said acquisition buffer; recording with said acquisition means in said acquisition buffer current events in place of earlier events, to insure that said acquisition buffer contains, at any given time, a record of the most recent events;

providing triggering means to activate the preservation of all or part of said record of the most recent events recorded in said acquisition buffer, upon the detection of any of one or more predetermined events; and preserving any portion or portions of said record of events selected by said user, said preserving step comprising at least one of the following steps:

reserving a portion of said record of events from being overwritten by other events; and transferring said selected portions of the record of events to a predetermined permanent location.

2. The process of claim 1, further comprising the steps of:
- continuing to record, in the acquisition buffer or elsewhere, the triggering event and the events following the triggering event, and
- copying to said predetermined location, concurrently with said continuous recording, all or part of the contents of the acquisition buffer existing at the time of said triggering event, thereby preserving a continuous record of events prior to, including, and following the triggering event.

3. The process of claim 2, further comprising the steps of recording events directly to said permanent location once said copying process has caught up with said continuous recording process.

4. A device for selectively recording events, said device comprising:
- an acquisition buffer comprising at least one finite extent of a recording medium; a recorder in said acquisition buffer for recording current events in place of earlier events, to insure that said acquisition buffer contains, at any given time, a record of the most recent events;
- a trigger for activating the preservation of all or part of said record of the most recent events recorded in said acquisition buffer, upon the detection of any of one or more predetermined events; and
- preserving means to preserve any portion or portions of said record of events selected by said user, said preserving means includes:
- reserving means for reserving a portion of said record of events from being overwritten by other events; and
- transferring means for transferring said selected portions of the record of events to a predetermined location.

5. A process for recording telephone conversation, said process comprising the steps of:
- providing an acquisition buffer comprising at least one finite extent of a recording medium;
- providing a continuous acquisition means for recording telephone conversation events in said acquisition buffer;
- recording with said acquisition means in said acquisition buffer current events in place of earlier events, to insure that said acquisition buffer contains, at any given time, a record of the most recent events;
- preserving any portion or portions of said record of events selected by a party to said conversation, said preserving step comprising at least one of the following steps:
- reserving a portion of said record of events from being overwritten by other events; and
- transferring said selected portions of the record of events to a predetermined permanent location.

6. The method of claim 5, further providing an indication audible to said party or parties when any said party moves to recall or preserve a portion of the conversation.

7. The method of claim 5, further comprising the step of replaying audibly for a said party parties a portion of said conversation that a said party has selected for recall or preservation.

8. The method of claim 5, further comprising the step of requiring the consent or a said party or parties to the recall or preservation of a portion of said conversation before effecting said recall or preservation.

9. The method of claim 5, further comprising the step of authenticating the identity of a party.

10. The method of claim 5, wherein said authentication is effected by cryptographic means.

11. The method of claim 5, wherein said authentication is effected by biometric means.

12. The method of claim 5, further comprising the step of clearing said acquisition buffer when any said party has left said conversation.

13. A portable device for selectively recording events, said device comprising:
- an acquisition buffer comprising at least one finite extent of a recording medium;
- a microphone for acquiring input of speech or other sounds into said acquisition buffer;
- a fastener for attaching said device to a user's person or clothing;
- a recorder in said acquisition buffer for recording current events in place of earlier events, to insure that said acquisition buffer contains, at any given time, a record of the most recent events;
- a selector for enabling a user to select a portion or portions of said record of the most recent events recorded in said acquisition buffer to determine which portion or portions, if any, of said record of events will be preserved; and
- a preserver to preserve any portion or portions of said record of events selected by said user, said preserving means includes:
- a reserver to reserve a portion of said record of events from being overwritten by other events; and
- a transferor for transferring said selected portions of the record of events to a predetermined location.

14. The device of claim 13, wherein said fastener is a clip.

15. The device of claim 13, wherein said fastener is a wrist band or bracelet.

16. The device of claim 13, wherein said predetermined location comprises flash memory.

17. A portable device for selectively recalling events, said device comprising:
- an acquisition buffer comprising at least one finite extent of a recording medium;
- a microphone for acquiring input of speech or other sounds into said acquisition buffer,
- a fastener for attaching said device to a user's person or clothing;
- a recorder for recording current events in said acquisition buffer in place of earlier events, to insure that said acquisition buffer contains, at any given time, a record of the most recent events;
- a selector for enabling a user to select a portion or portions of said record of the most recent events recorded in said acquisition buffer to determine which portion or portions, if any, of said record of events will be preserved; and
- recall means for reproducing said record of events and any portion or portions of said record of events selected by said user using said selector.

18. The device of claim 17, wherein said fastener is a clip.

19. The device of claim 17, wherein said fastener is a wrist band or bracelet.

* * * * *